United States Patent
Lee et al.

(10) Patent No.: US 12,381,150 B2
(45) Date of Patent: Aug. 5, 2025

(54) ELECTRONIC DEVICE

(71) Applicant: Advanced Semiconductor Engineering, Inc., Kaohsiung (TW)

(72) Inventors: Pao-Nan Lee, Kaohsiung (TW); Jung Jui Kang, Kaohsiung (TW); Chang Chi Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 455 days.

(21) Appl. No.: 17/870,674

(22) Filed: Jul. 21, 2022

(65) Prior Publication Data

US 2024/0030135 A1 Jan. 25, 2024

(51) Int. Cl.
| | |
|---|---|
| *H01L 23/528* | (2006.01) |
| *H01L 23/00* | (2006.01) |
| *H01L 23/48* | (2006.01) |
| *H01L 23/498* | (2006.01) |
| *H01L 23/522* | (2006.01) |

(52) U.S. Cl.
CPC ........ *H01L 23/5286* (2013.01); *H01L 23/481* (2013.01); *H01L 23/49816* (2013.01); *H01L 23/5226* (2013.01); *H01L 24/16* (2013.01); *H01L 24/48* (2013.01); *H01L 24/73* (2013.01); H01L 2224/16227 (2013.01); H01L 2224/48091 (2013.01); H01L 2224/48248 (2013.01); H01L 2224/73265 (2013.01)

(58) Field of Classification Search
CPC .............. H01L 23/5286; H01L 23/481; H01L 23/49816; H01L 23/5226; H01L 24/16; H01L 24/48; H01L 24/73; H01L 2224/16227; H01L 2224/48091; H01L 2224/48248; H01L 2224/73265
USPC ........................................................ 257/621
See application file for complete search history.

(56) References Cited

U.S. PATENT DOCUMENTS

| | | | |
|---|---|---|---|
| 8,198,716 B2 | 6/2012 | Periaman et al. | |
| 8,692,368 B2 | 4/2014 | Pan et al. | |
| 8,982,563 B2 | 3/2015 | Raj et al. | |
| 11,004,783 B2 | 5/2021 | Calugaru | |
| 2004/0027802 A1* | 2/2004 | Duerbaum | H05K 1/141 361/688 |
| 2023/0095063 A1* | 3/2023 | Choi | H01L 23/645 323/282 |
| 2023/0154913 A1* | 5/2023 | Tsai | H01L 25/0657 438/666 |
| 2023/0163098 A1* | 5/2023 | Elsherbini | H01L 25/0652 257/532 |

* cited by examiner

*Primary Examiner* — Tu-Tu V Ho
(74) *Attorney, Agent, or Firm* — FOLEY & LARDNER LLP

(57) ABSTRACT

An electronic device is disclosed. The electronic device includes a carrier including a first region and a second region distinct from the first region. The electronic device also includes an electronic component covering the first region and at least partially exposing the second region. The electronic device also includes a first power regulating element in the second region of the carrier and a second power regulating element. The second power regulating element is disposed adjacent to the first power regulating element and electrically connected to the electronic component through the first power regulating element to provide a first power path.

14 Claims, 11 Drawing Sheets

ELECTRONIC DEVICE

BACKGROUND

1. Field of the Disclosure

The present disclosure generally relates to an electronic device.

2. Description of the Related Art

A power regulating device and power regulating circuitry for transmitting power signals are provided adjacent to an active surface of a component, thus allowing the power signals to be transmitted to the active surface of the component via the shortest vertical power path.

However, since power signals and non-power signals (such as high-speed signals) are transmitted through the same surface (i.e., the active surface) of the component, input/output (I/O) pins carrying electrical signals may be occupied and limited. To adapt to demands of high-speed data communication, a larger component with more I/O pins may be required and manufacturing costs may inevitably become higher.

SUMMARY

In some embodiments, an electronic device includes a carrier including a first region and a second region distinct from the first region. The electronic device also includes an electronic component covering the first region and at least partially exposing the second region. The electronic device also includes a first power regulating element in the second region of the carrier and a second power regulating element. The second power regulating element is disposed adjacent to the first power regulating element and electrically connected to the electronic component through the first power regulating element to provide a first power path.

In some embodiments, an electronic device includes a carrier including a first region and a second region distinct from the first region. The electronic device also includes an electronic component disposed over the first region of the carrier and a deep trench capacitor (DTC) in the second region of the carrier. The DTC is configured to provide a power to the electronic component by a first power path passing through a backside surface of the electronic component.

In some embodiments, an electronic device includes a carrier including a first region and a second region distinct from the first region. The electronic device also includes an electronic component disposed over the first region and a first power regulating element in the second region of the carrier and at least partially exposed from the electronic component. The first power regulating element and the electronic component are collectively configured to provide a first power path extending along a first lateral side surface of the electronic component to a backside surface of the electronic component.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
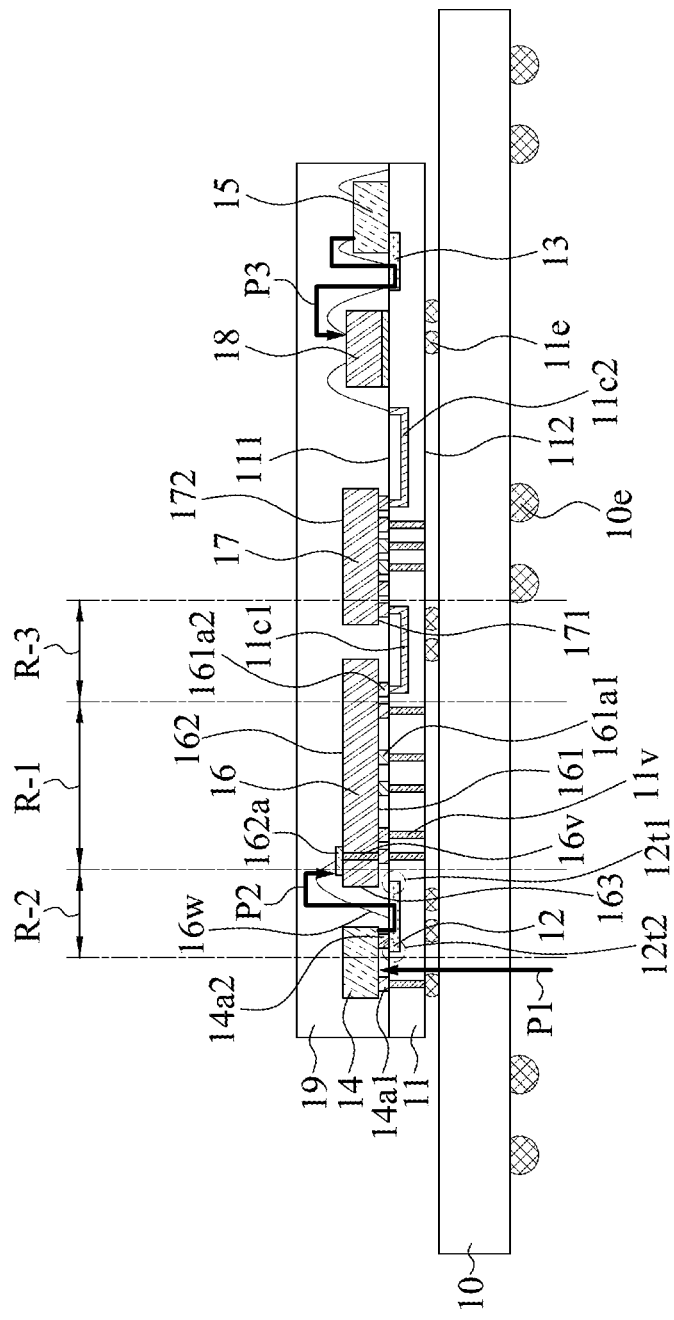
FIG. 1A illustrates a cross-sectional view of an example of an electronic device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A illustrates a cross-sectional view of an example of an electronic device 1 according to some embodiments of the present disclosure. In some embodiments, the electronic device 1 may include a package, such as a semiconductor device package. In some embodiments, the electronic device 1 may include carriers 10, 11, power regulating circuits 12, 13, power regulating devices 14, 15, electronic components 16, 17, 18, and an encapsulant 19.

The carrier 10 may include, for example, a printed circuit board (PCB), such as a paper-based copper foil laminate, a composite copper foil laminate, or a polymer-impregnated glass-fiber-based copper foil laminate. In some embodiments, the carrier 10 may include a substrate or a package substrate. In some embodiments, the carrier 10 may include an interconnection structure, such as a redistribution layer (RDL) and/or a grounding element.

The carrier 10 may include one or more conductive pads (not shown) in proximity to, adjacent to, or embedded in and exposed from one or more surfaces of the carrier 10. One or more electrical contacts 10e may be disposed on or over the conductive pads and can provide electrical connections between the electronic device 1 and external components (e.g., external circuits or external circuit boards). In some embodiments, the electrical contacts 10e may include solder balls or solder bumps, such as a controlled collapse chip connection (C4) bump, a ball grid array (BGA) or a land grid array (LGA).

The carrier 11 may be disposed on or over the carrier 10 and may be electrically connected with the carrier 10 through one or more electrical contacts 11e. In some embodiments, the electrical contacts 11e may include solder balls or solder bumps, such as a C4 bump, a BGA or an LGA.

The carrier 11 may include a surface 111 facing away from the carrier 10 and a surface 112 facing the carrier 10. The carrier 11 may include an interconnection structure. In some embodiments, the carrier 11 may include an interposer (such as a silicon interposer) or include interposer-like wiring to form a structure which may be regarded as an interposer or a fan-out substrate. In some embodiments, the carrier 11 may include, for example, silicon (Si), glass or other suitable materials. In some embodiments, the carrier 11 may include a single or a monolithic structure.

The carrier 11 may include portions or regions R-1, R-2, and R-3, among other regions. The regions R-1, R-2 and R-3 may be laterally spaced apart from one another. For example, the regions R-1, R-2, and R-3 may not overlap along a direction substantially perpendicular to the surfaces 111 and/or 112.

It is noted that the regions R-1, R-2, and R-3 may not have visible or observable boundaries. The region R-2 may abut or be connected with the region R-1, and the region R-1 may abut or be connected with the region R-3. In other embodiments, the region R-2 may be laterally spaced apart from the region R-1 by a gap or a distance, and the region R-1 may be laterally spaced apart from the region R-3 by a gap or a distance. The regions R-1, R-2, and R-3 of the carrier 11 may include or encompass surface regions of the surface 111 or imaginary sections of the carrier 11.

The regions R-1, R-2, and R-3 of the carrier 11 may be configured to provide electrical connections, including, for example, the power routing path (or the power path) and the non-power routing path (or the non-power path) in the electronic device 1.

As used herein, a power path may refer to a path dedicated to power supply connections. Additionally, a non-power path may refer to a path through which a non-power signal may be transmitted. Non-power signals may include analog signals, digital signals, clock signals or electrical signals other than power signals.

For example, the region R-2 may be configured to provide a part of a power path "P2" for transmitting a power signal (or abbreviated as "a power") from the power regulating device 14 to a backside surface (e.g., a surface 162) of the electronic component 16. For example, the power regulating circuit 12 may be disposed over or on the region R-2 to provide a part of the power path P2. More details of the power regulating circuit 12 will be provided below.

The region R-1 may be configured to provide a non-power path for transmitting a non-power signal between the carrier 11 and an active surface (e.g., a surface 161) of the electronic component 16. For example, one or more conductive elements 11v may be arranged over or on the region R-1 to provide the non-power path.

The conductive elements 11v may extend between the surfaces 111 and 112 of the carrier 11. The conductive elements 11v may penetrate the carrier 11. The conductive elements 11v may include a conductive pillar, a conductive via (such as a through-silicon via (TSV)), a conductive trace, a conductive wire, or other feasible connectors.

The region R-3 may be configured to provide a non-power path for transmitting a non-power signal between an active surface (e.g., a surface 171) of the electronic component 17 and the active surface (e.g., the surface 161) of the electronic component 16. For example, a circuit region 11c1 may be arranged on the region R-3 to provide the non-power path. In addition, the carrier 11 may further include a circuit region 11c2 for transmitting non-power signals between the electronic components 17 and 18.

In some embodiments, the circuit region 11c1 and the circuit region 11c2 may also be referred to as bridge regions, as they function as bridges for data transmissions among the electronic components 16, 17, and 18.

In some embodiments, the circuit regions 11c1 and 11c2 may each include a high-speed circuitry region and/or a high-density circuitry region. For example, a circuit density in the circuit region 11c1 may be relatively higher than that in the region R-1. For example, a wiring density per unit area in the circuit region 11c1 may be relatively higher than that in the region R-1. For example, a line spacing and/or a pad pitch in the circuit region 11c1 may be relatively narrower than that in the region R-1. For example, a pad pitch in the circuit region 11c1 may be relatively narrower than a pad pitch in the region R-1 by about an order. For example, a pad pitch in the region R-1 may range from about 10.0 micrometers ($\mu$m) to about 20.0 $\mu$m while a pad pitch in the circuit region 11c1 may range from about 1.0 $\mu$m to about 2.0 $\mu$m.

Figure 6A:
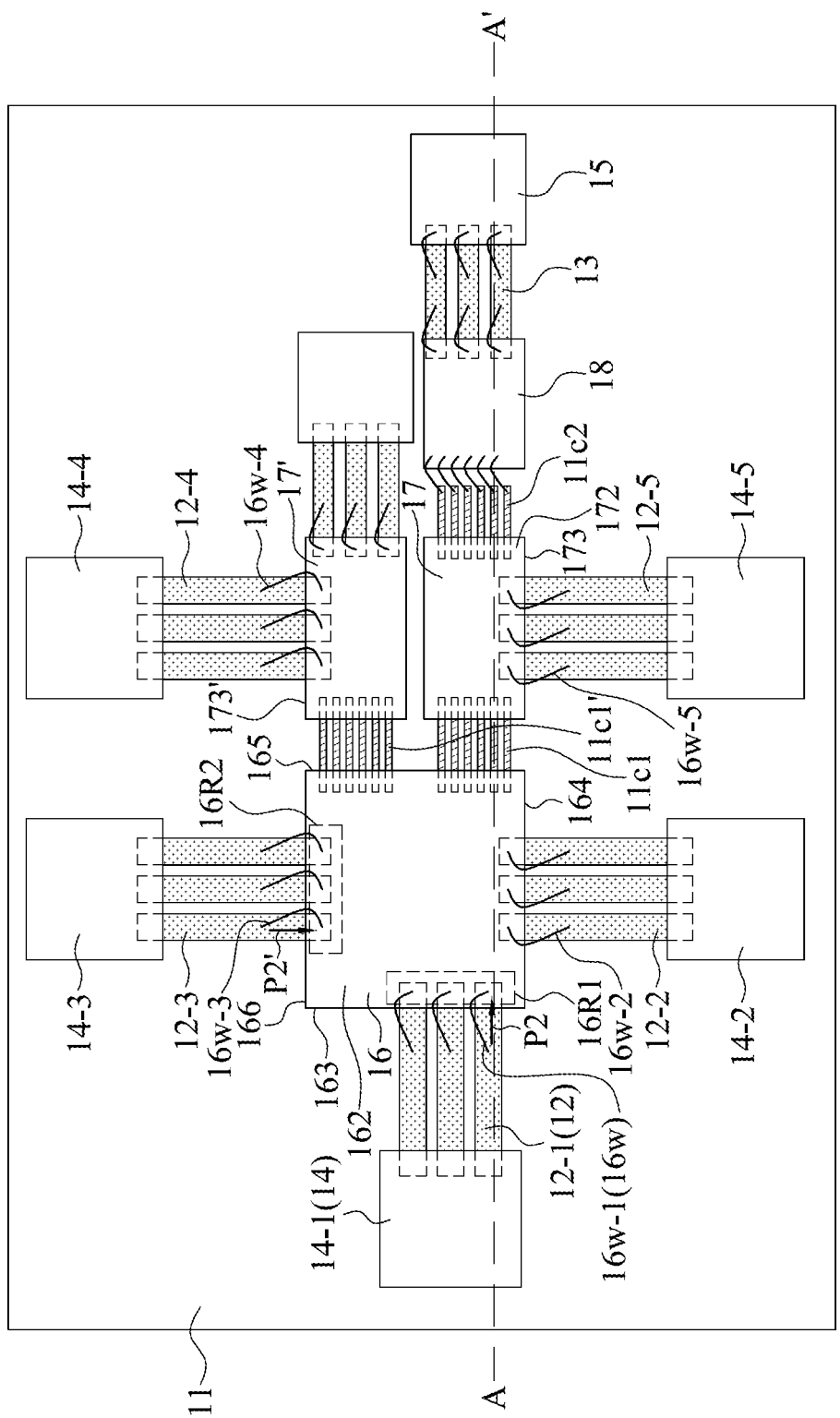
FIG. 6A illustrates a top view of an example of an electronic device according to some embodiments of the present disclosure.

In some embodiments, as shown in a top view of FIG. 6A, the circuit regions 11c1 and 11c2 may each include a plurality of electrical paths. For example, the circuit region 11c1 may include a plurality of electrical paths extending between the electronic components 16 and 17.

In some embodiments, the circuit regions 11c1 and 11c2 may include electrical paths or electrical traces integrated in the carrier 11. In some other embodiments, the circuit region 11c1 may be a discrete component separately formed and then provided in a cavity of the carrier 11. Similarly, the circuit region 11c2 may be a discrete component separately formed and then provided in a cavity of the carrier 11.

By using the carrier 11 having the regions R-1, R-2, and R-3, electrical connections of different signals and different data transmission speeds may be carried out by a single or a monolithic structure (i.e., the carrier 11). In other words, the carrier 11 may provide electrical connections of different signals and different data transmission speeds for the electronic components 16, 17, and 18.

The power regulating circuit 12 may be disposed over or on the region R-2 of the carrier 11. For example, the power regulating circuit 12 may be embedded, accommodated, or integrated in the carrier 11. The power regulating circuit 12 may be at least partially exposed from the surface 111 of the carrier 11. The region R-2 of the carrier 11 may be configured to accommodate the power regulating circuit 12.

The power regulating circuit 12 may include a passive component, such as an inductance device and/or a capacitance device. In some embodiments, the capacitance device may include a deep trench capacitor (DTC), a DTC array, a multi-layer ceramic capacitor (MLCC), or other capacitors.

The power regulating circuit 12 may include a power regulating element or a power regulating device. The power regulating circuit 12 may be configured to provide, define, construct, or establish a part of the power path P2 for transmitting a power signal from the power regulating device 14 to the backside surface (e.g., the surface 162) of the electronic component 16. For example, the power regulating circuit 12 may be electrically connected between the power regulating device 14 and the backside surface (e.g., the surface 162) of the electronic component 16.

For example, the power regulating device 14 and the backside surface (e.g., the surface 162) of the electronic component 16 may be connected through the power regulating circuit 12. For example, the power regulating device 14 and/or the backside surface (e.g., the surface 162) of the electronic component 16 may be connected in series with an inductance device of the power regulating circuit 12. For example, the power regulating device 14 and/or the backside surface (e.g., the surface 162) of the electronic component 16 may be connected in parallel with a capacitance device of the power regulating circuit 12.

The power regulating circuit 13 may be similar to the power regulating circuit 12. Therefore, some detailed descriptions may refer to the corresponding paragraphs above and are not repeated hereinafter for conciseness. The power regulating circuit 13 may be configured to provide, define, construct, or establish a part of a power path "P3" for transmitting a power signal from the power regulating device 15 to the electronic component 18.

In some embodiments, the power regulating circuits 12 and 13 may each be electrically disconnected from the carrier 11. For example, the power regulating circuits 12 and 13 may each be electrically disconnected from other power paths or non-power paths in the carrier 11. For example, the power regulating circuit 12 may be electrically disconnected from the power regulating circuit 13. For example, the power regulating circuit 12 may be electrically disconnected from the power path P3. For example, the power regulating circuit 12 may be electrically disconnected from the conductive elements 11v. For example, the power regulating circuit 12 may be electrically disconnected from the circuit regions 11c1 and 11c2.

In some embodiments, the power regulating circuit 12 may be a discrete component separately formed and then provided in a cavity of the carrier 11. Similarly, the power regulating circuit 13 may be a discrete component separately formed and then provided in a cavity of the carrier 11.

As shown in FIG. 1A, the power path P2 may include the power regulating circuit 12 and a conductive wire 16w. The power path P2 may be exclusive of an electrical path of the carrier 11. In other words, an electrical path of the carrier 11 may not be a part of the power path P2. Although the power path P2 may penetrate the surface 111 and extend into the power regulating circuit 12, the power path P2 is provided by the power regulating circuit 12, not provided by an electrical path of the carrier 11.

The power regulating device 14 may be disposed over the surface 111 of the carrier 11. The power regulating device 14 and the electronic component 16 may be disposed over the same side or the same surface of the carrier 11. The power regulating device 14 and the electronic component 16 may be disposed side-by-side. The power regulating device 14 may be laterally spaced apart from the electronic component 16.

The power regulating device 14 may be electrically connected with the carrier 11 by way of flip-chip techniques. For example, the power regulating device 14 may be electrically connected with the carrier 11 by an electrical contact 14a1. The power regulating device 14 may be electrically connected with the power regulating circuit 12 by way of flip-chip techniques. For example, the power regulating device 14 may be electrically connected with the power regulating circuit 12 by an electrical contact 14a2. The electrical contact 14a1 may be configured to receive or carry a power signal from the carrier 11 and the electrical contact 14a1 may be configured to transmit or carry a power signal to the power regulating circuit 12.

However, in some other embodiments, the power regulating device 14 may be electrically connected with the carrier 11 and the power regulating circuit 12 by way of wire-bonding techniques in the same way as the power regulating device 15.

The power regulating device 14 and the power regulating circuit 12 may be at least partially overlapped with each other vertically (or along a direction substantially perpendicular to the surface 111 of the carrier 11). For example, an edge or a side of the power regulating device 14 extends to cover and to connect to the power regulating circuit 12.

The power regulating device 14 may be configured to receive a power signal from a power source through the carrier 11, as indicated by the power path "P1." The power regulating device 14 may regulate the power signal and provide a regulated power signal to the electronic component 16 through the power regulating circuit 12 and the conductive wire 16w, as indicated by the power path P2.

The power path P2 may go down from the power regulating device 14 toward the power regulating circuit 12, extend in a direction substantially parallel to the surface 111, and then go up from the power regulating circuit 12 toward the backside surface (e.g., the surface 162) of the electronic component 16 along the conductive wire 16w. Generally, the power path P2 extends toward the carrier 11 and then extends in a substantially reverse direction. In some embodiments, as described, since the power path P2 may be exclusive of an electrical path of the carrier 11, the carrier 11 may provide structural support (instead of an electrical connection) for the power path P2.

The power regulating device 15 may be disposed over the surface 111 of the carrier 11. The power regulating device 15 and the electronic component 18 may be disposed over the same side or the same surface of the carrier 11. The power regulating device 15 and the electronic component 18 may be disposed side-by-side.

The power regulating device 15 may be similar to the power regulating device 14. Some detailed descriptions of the power regulating device 15 may refer to the corresponding preceding paragraphs and are not repeated hereinafter for conciseness.

In some embodiments, the power regulating devices 14 and 15 may also be referred to as power regulating elements. In some embodiments, the power regulating devices 14 and 15 may each include a power management integrated circuit (PMIC). In some embodiments, the power regulating devices 14 and 15 may each include a voltage regulator, such as a linear regulator (which is configured to maintain a constant output voltage) or a switching regulator (which is configured to generate an output voltage higher than or lower than the input voltage). In some embodiments, the power regulating devices 14 and 15 may each include a step-down (buck) converter, a step-up (boost) converter, an analog-to-digital converter, a digital-to-analog converter, an AC-DC converter, a DC-DC converter, other types of converters, or a combination thereof.

The positions and number of the power regulating devices in the electronic device 1 are not intended to limit the present disclosure. For example, there may be any number of power regulating devices in the electronic device 1 due to design requirements.

The electronic component 16 may be disposed over the surface 111 of the carrier 11. In some embodiments, the electronic component 16 may include a surface 161 facing the carrier 11, a surface 162 (which is opposite to the surface 161) facing away from the carrier 11, and lateral surfaces (e.g., a surface 163) extending between the surfaces 161 and 162. The surface 161 may include an active surface and the surface 162 may include a backside surface or a rear surface. The electronic component 16 may include a conductive via (such as a through-silicon via (TSV) 16v extending between the surfaces 161 and 162.

In some embodiments, the active surface (e.g., the surface 161) of the electronic component 16 may be electrically connected with the carrier 11 by way of flip-chip techniques. For example, the active surface (e.g., the surface 161) of the electronic component 16 may be electrically connected with the conductive elements 11v of the carrier 11 through one or more electrical contact 161a1 on the surface 161.

In some embodiments, the electronic component 16 may be electrically connected with the circuit region 11c1 of the carrier 11 through one or more electrical contact 161a2 on the surface 161. As described, the circuit region 11c1 of the carrier 11 may function as a bridge for data transmission between the electronic components 16 and 17. Therefore, a pad pitch of the electrical contact 161a2 may be relatively narrower than a pad pitch of the electrical contact 161a1 by, for example, about an order. For example, a pad pitch of the electrical contact 161a1 may range from about 10.0 μm to about 20.0 μm while a pad pitch of the electrical contact 161a2 may range from about 1.0 μm to about 2.0 μm.

In some embodiments, the backside surface (e.g., the surface 162) of the electronic component 16 may be electrically connected with the power regulating circuit 12 through a wire-bonding pad 162a and the conductive wire 16w connecting the wire-bonding pad 162a. The wire-bonding pad 162a may be electrically connected with the active surface (e.g., the surface 161) of the electronic component 16 through the conductive via 16v.

In some embodiments, the conductive wire 16w may include conductive materials, such as copper (Cu), tin (Sn), aluminum (Al), gold (Au), silver (Ag), tungsten (W), nickel (Ni), or other suitable materials. In some embodiments, the conductive wire 16w may extend along the lateral surface (e.g., the surface 163) of the electronic component 16. For example, the conductive wire 16w may extend between the surface 111 of the carrier 11 and the surface 162 of the electronic component 16. In some other embodiments, the backside surface (e.g., the surface 162) of the electronic component 16 may be electrically connected with the power regulating circuit 12 through another connection element.

The electronic component 16 and the power regulating circuit 12 may be at least partially overlapped with each other vertically (or along a direction substantially perpendicular to the surface 111 of the carrier 11). At least a part of the power regulating circuit 12 may be exposed from (or uncovered by) the electronic component 16.

In some embodiments, the electronic component 16 may include a processor, a controller, a memory, or an input/output (I/O) buffer, etc. In some embodiments, the electronic component 16 may include, for example, a central processing unit (CPU), a microprocessor unit (MPU), a graphics processing unit (GPU), a microcontroller unit (MCU), an application-specific integrated circuit (ASIC), a field-programmable gate array (FPGA), or other types of integrated circuits (ICs).

The electronic components 17 and 18 may be similar to the electronic component 16. Some detailed descriptions of the electronic components 17 and 18 may refer to the corresponding preceding paragraphs and are not repeated hereinafter for conciseness. In some other embodiments, the electronic components 17 and 18 may each include a data storage element. In some embodiments, the electronic components 17 and 18 may each include a non-volatile memory (such as a flash memory and a read-only memory (ROM)) or a volatile memory (such as a Dynamic Random Access Memory (DRAM)). In some embodiments, the electronic components 17 and 18 may each include a high bandwidth memory (HBM).

The positions and number of the electronic components in the electronic device 1 are not intended to limit the present disclosure. For example, there may be any number of electronic components in the electronic device 1 due to design requirements. In addition, the electrical connections for the electronic components are not limited to the present disclosure. For example, flip-chip or wire-bond techniques may be applied depending on design requirements.

The encapsulant 19 may be disposed over the carrier 11 and cover, encapsulate or surround the power regulating devices 14 and 15, and the electronic components 16, 17, and 18.

In some embodiments, the encapsulant 19 may include an epoxy resin having fillers, a molding compound (e.g., an epoxy molding compound or another molding compound), a polyimide, a phenolic compound or material, a material with a silicone dispersed therein, or a combination thereof.

According to some embodiments of the present disclosure, by arranging the power regulating device (such as the power regulating device 14) and the electronic component (such as the electronic component 16) side-by-side as opposed to stacking them, the thickness of the package size may be further decreased.

In addition, a power signal may be transmitted to the electronic component 16 through the backside surface (e.g., the surface 162) without consuming I/O pins on the active surface (e.g., surface 161) of the electronic component 16. Thus, more I/O pins can be used to transmit a non-power signal in the circuit region 11c1. The circuit region 11c1 may be disposed farther from the power signal and the impact from parasitic effects may be reduced.

Furthermore, since the power regulating circuits 12 and 13 (and other passive components, if any, for routing the power paths P2 and P3) are formed as monolithic components before being disposed in the carrier 11, the production rate and the manufacturing yield can be increased.

Figure 1B:
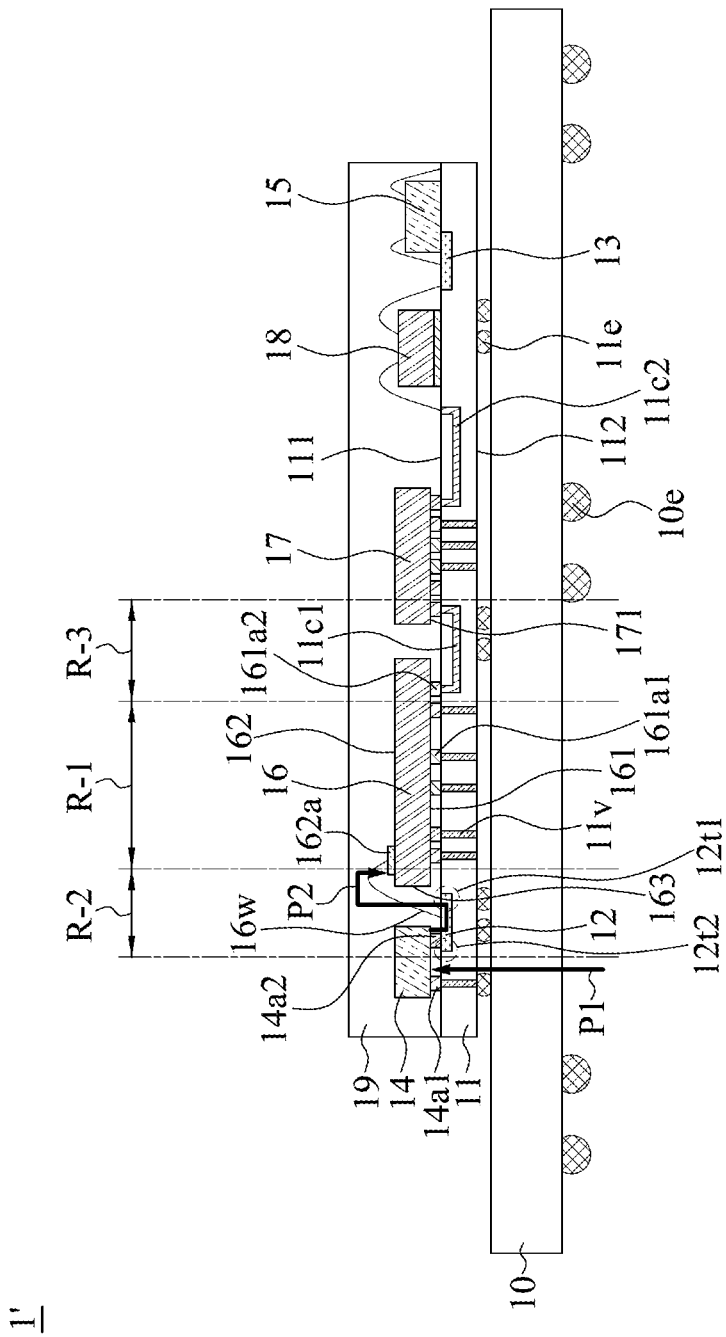
FIG. 1B illustrates a cross-sectional view of an example of an electronic device according to some embodiments of the present disclosure.

FIG. 1B illustrates a cross-sectional view of an example of an electronic device 1' according to some embodiments of the present disclosure. The electronic device 1' is similar to the electronic device 1 in FIG. 1A, with differences therebetween as follows.

In FIG. 1A, the electronic component 16 and the power regulating circuit 12 may be at least partially overlapped with each other vertically (or along a direction substantially perpendicular to the surface 111 of the carrier 11). A terminal 12t1 of the power regulating circuit 12 may be covered by or overlapped with the electronic component 16. A terminal 12t2 of the power regulating circuit 12 may be exposed from (or uncovered by) the electronic component 16. The terminal 12t of the power regulating circuit 12 may be a part of the power path P2. Therefore, a dimension (e.g., a width) of the package size may be decreased.

In FIG. 1B, the electronic component 16 and the power regulating circuit 12 may be non-overlapped with each other vertically (or along a direction substantially perpendicular to the surface 111 of the carrier 11). At least the terminal 12t2 of the power regulating circuit 12 may be exposed from (or uncovered by) the electronic component 16. The terminal 12t of the power regulating circuit 12 may be a part of the power path P2.

As such, a greater surface area is available for bonding the conductive wire 16w to facilitate the bonding operation; and thus, the manufacturing yield can be increased.

Figure 1C:
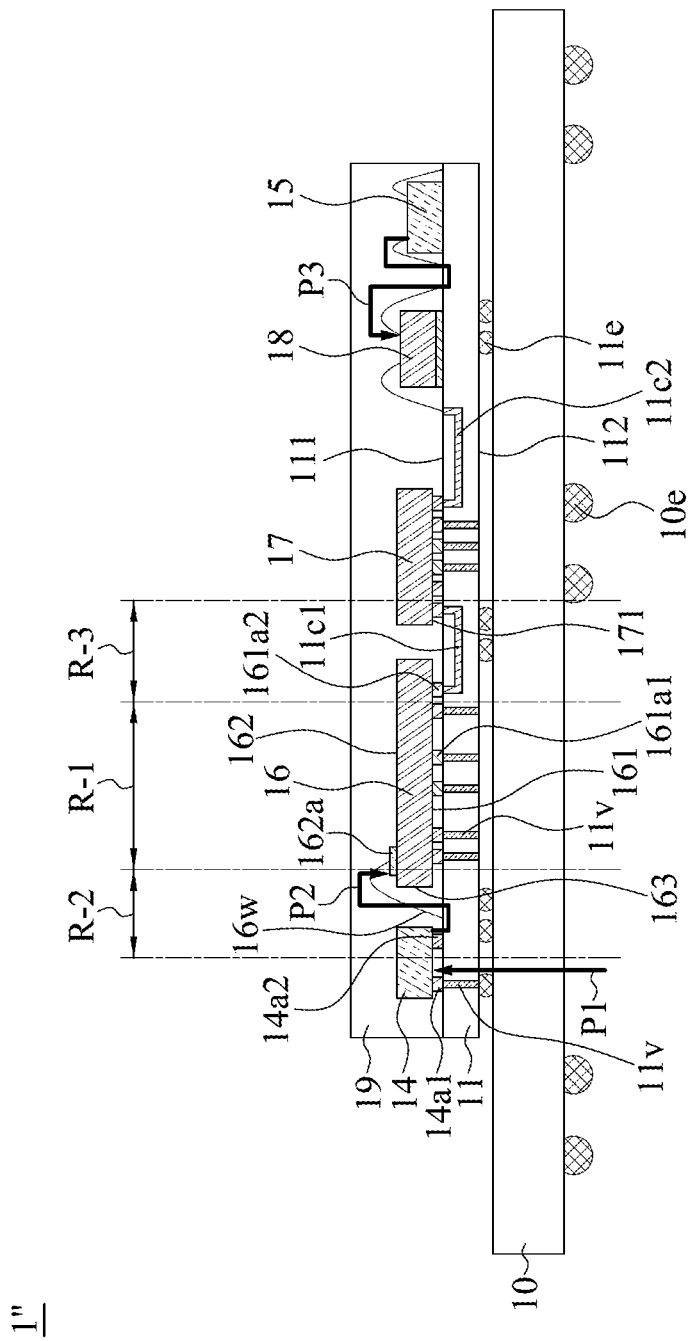
FIG. 1C illustrates a cross-sectional view of an example of an electronic device according to some embodiments of the present disclosure.

FIG. 1C illustrates a cross-sectional view of an example of an electronic device 1″ according to some embodiments of the present disclosure. The electronic device 1″ is similar to the electronic device 1 in FIG. 1A except that the power regulating circuits 12 and 13 are omitted.

Electrical paths in the region R-2 of the carrier 11 may be configured to provide, define, construct, or establish a part of the power path P2. Similarly, electrical paths of the carrier 11 may be configured to provide, define, construct, or establish a part of the power path P3. Passive components for routing the power paths P2 and P3 may be integrated in the carrier 11 to reduce manufacturing costs by eliminating the need for separately forming monolithic components.

Figure 2:
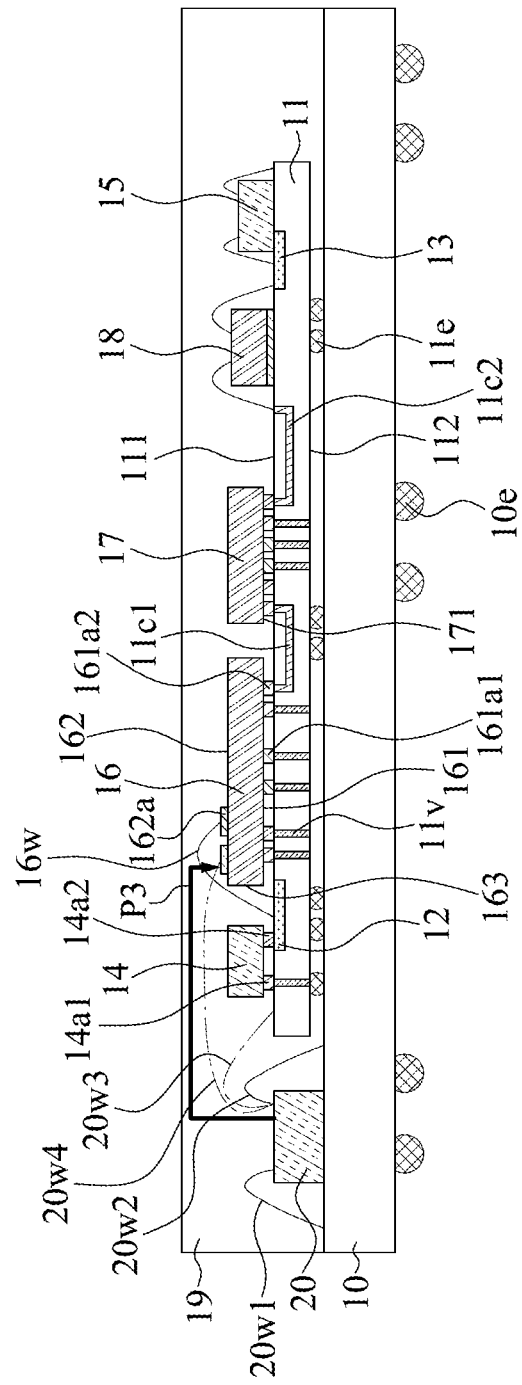
FIG. 2 illustrates a cross-sectional view of an example of an electronic device according to some embodiments of the present disclosure.

FIG. 2 illustrates a cross-sectional view of an example of an electronic device 2 according to some embodiments of the present disclosure. The electronic device 2 is similar to the electronic device 1 in FIG. 1A, with differences therebetween as follows.

The electronic device 2 further includes a power regulating device 20 disposed over the carrier 10. The power regulating device 20 may be laterally spaced apart from the carrier 11. The power regulating device 20 may be disposed on a side of the carrier 11.

In some embodiments, the power regulating device 20 may be electrically connected with the carrier 10 and/or the carrier 11 by way of wire-bond techniques. For example, the power regulating device 20 may be electrically connected with the carrier 10 through conductive wires 20w1 and 20w2. Alternatively, the conductive wire 20w2 may be replaced with a conductive wire 20w3 connecting to the carrier 11 or a conductive wire 20w4 connecting to the electronic component 16. The conductive wire 20w3 and the conductive wire 20w4 are illustrated in dashed lines to show that there are other options for arranging the conductive wires.

For example, the power regulating device 20 may be electrically connected with the power regulating device 14 through the conductive wire 20w2, the carrier 10, and the carrier 11. For example, the power regulating device 20 may be electrically connected with the power regulating device 14 through the conductive wire 20w3 and the carrier 11. For example, the power regulating device 20 may be electrically connected with the electronic component 16 through the conductive wire 20w4.

In some embodiments, the power regulating device 20 may be configured to receive a power signal from a power source through the carrier 10. The power regulating device 20 may regulate the power signal and provide a regulated power signal to the power regulating device 14 through the carrier 10 and/or the carrier 11. The power regulating device 14 may receive the regulated power signal from the power regulating device 20, perform another power regulating operation, and provide another regulated power signal to the electronic component 16.

In some embodiments, the original power signal from the power source may be converted or adjusted twice before being received by the electronic component 16. As a result, the acceptable voltage of the original power signal can be higher than the acceptable voltage in embodiments without using the power regulating device 20.

In some other embodiments, the power regulating device 20 may be configured to receive a power signal from a power source through the carrier 10, regulate the power signal, and provide a regulated power signal to the electronic component 16 through the conductive wire as indicated by the power path "P3." As a result, the power regulating device 20 and the power regulating device 14 may provide different types of power control to different regions of the electronic component 16.

Some detailed descriptions of the power regulating device 20 may refer to the corresponding preceding paragraphs of the power regulating device 14 and are not repeated hereinafter for conciseness.

In some embodiments, the encapsulant 19 may be disposed over the carrier 10 to also cover the power regulating device 20.

Figure 3:
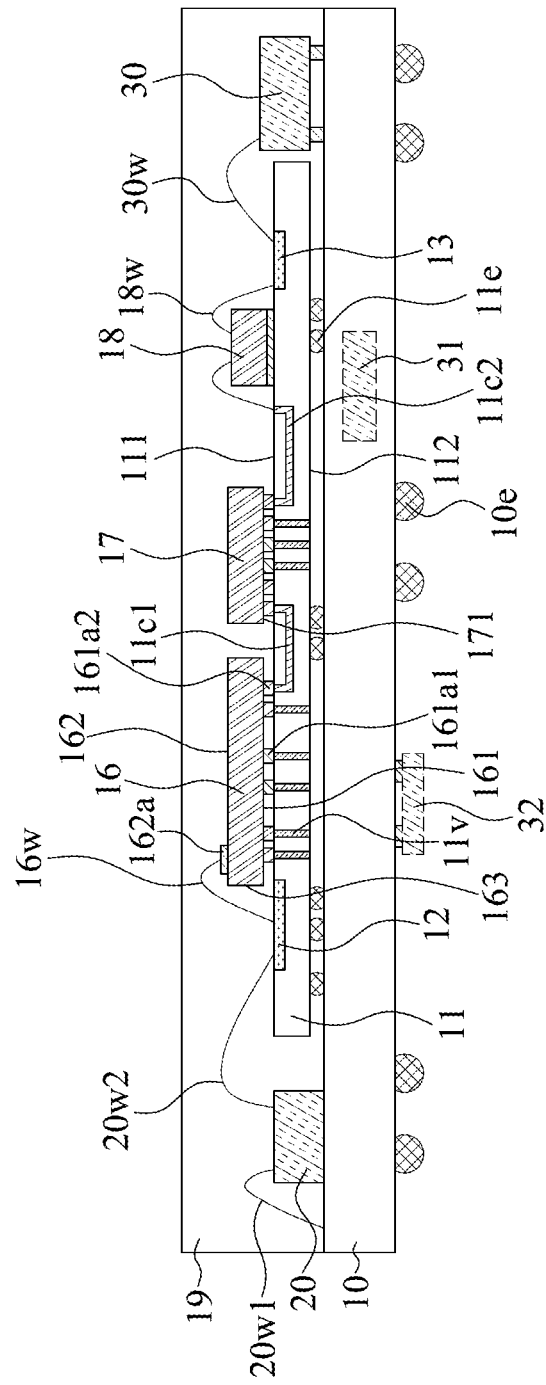
FIG. 3 illustrates a cross-sectional view of an example of an electronic device according to some embodiments of the present disclosure.

FIG. 3 illustrates a cross-sectional view of an example of an electronic device 3 according to some embodiments of the present disclosure. The electronic device 3 is similar to the electronic device 1 in FIG. 1A, with differences therebetween as follows.

The power regulating devices 14 and 15 in FIG. 1A are replaced with the power regulating devices 20 and 30. Some detailed descriptions of the power regulating device 20 may refer to the corresponding preceding paragraphs and are not repeated hereinafter for conciseness.

The power regulating device 30 may be laterally spaced apart from the carrier 11.

In some embodiments, the power regulating device 30 may be electrically connected with the carrier 10 by way of flip-chip techniques. In some embodiments, the power regulating device 30 may be electrically connected with the power regulating circuit 13 by way of wire-bond techniques (e.g., by a conductive wire 30w).

The power regulating device 30 may be configured to receive a power signal from a power source through the carrier 10. The power regulating device 30 may regulate the power signal and provide a regulated power signal to the electronic component 18 through the conductive wire 30w, the power regulating circuit 13 and a conductive wire 18w connected with the electronic component 18.

In some embodiments, the power regulating devices 20 and 30 are not disposed over the carrier 11. The I/O pins on the carrier 11 for connecting the power regulating devices 20 and 30 are not needed. Therefore, a dimension (e.g., a width) of the carrier 11 can be decreased and the manufacturing costs can be reduced.

Alternatively, the power regulating devices 20 or 30 may be replaced with power regulating devices 31 or 32.

The power regulating device 31 may be embedded in the carrier 10. In some embodiments, the power regulating device 31 may be electrically connected with the power regulating circuit 13 through a conductive element (e.g., a conductive wire or a conductive trace).

The power regulating device 32 may be disposed over a side of the carrier 10 opposite to the carrier 11. In some embodiments, the power regulating device 32 may be electrically connected with the power regulating circuit 12 through a conductive element (e.g., a conductive wire or a conductive trace).

The power regulating device 31 and the power regulating device 32 are illustrated in dashed lines to show that there are other options for arranging the power regulating devices.

Figure 4:
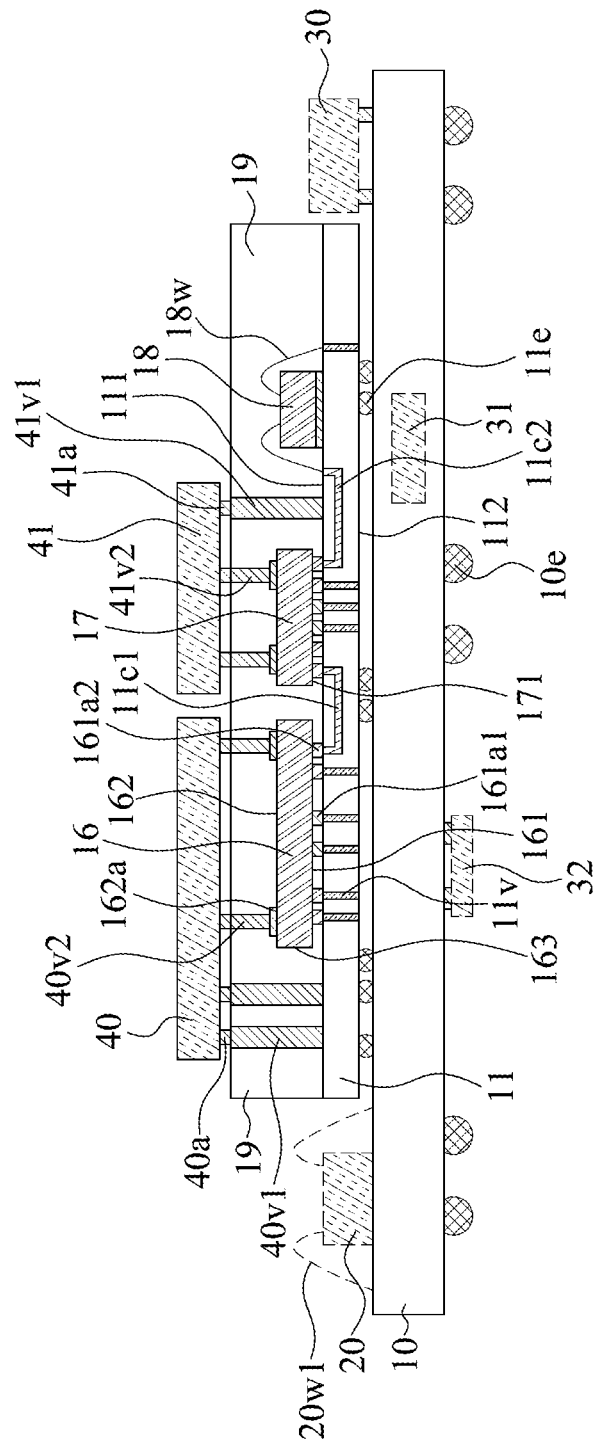
FIG. 4 illustrates a cross-sectional view of an example of an electronic device according to some embodiments of the present disclosure.

FIG. 4 illustrates a cross-sectional view of an example of an electronic device 4 according to some embodiments of the present disclosure. The electronic device 4 is similar to the electronic device 1 in FIG. 1A, with differences therebetween as follows.

The power regulating devices 14 and 15 in FIG. 1A are replaced with the power regulating devices 40 and 41. The power regulating devices 40 and 41 may be disposed over the encapsulant 19.

In some embodiments, the electronic device 4 may include conductive vias 40v1, 41v1, and 41v2. The conductive via 40v1 may extend between the power regulating device and the carrier 11. The conductive via 40v2 may extend between the power regulating device and the electronic component 16. The conductive via 41v1 may extend between the power regulating device 41 and the carrier 11. The conductive via 41v2 may extend between the power regulating device 41 and the electronic component 17.

The power regulating device 40 may be electrically connected with the conductive via 40v1 through an electrical contact 40a. The power regulating device 40 may be electrically connected with the conductive via 40v2 through another electrical contact 40a.

The power regulating device 40 may be configured to receive a power signal from a power source through the carrier 11 and the conductive via 40v1. The power regulating device 40 may regulate the power signal and provide a regulated power signal to the electronic component 16 through the conductive via 40v2.

The power regulating device 41 may be electrically connected with the conductive via 41v1 through an electrical contact 41a. The power regulating device 41 may be electrically connected with the conductive via 41v2 through another electrical contact 41a.

The power regulating device 41 may be configured to receive a power signal from a power source through the carrier 11 and the conductive via 41v1. The power regulating device 41 may regulate the power signal and provide a regulated power signal to the electronic component 17 through the conductive via 41v2.

Alternatively, the power regulating devices 40 or 41 may be replaced with power regulating devices 20, 30, 31, or 32. Some detailed descriptions of the power regulating devices 20, 30, 31, and 32 may refer to the corresponding preceding paragraphs and are not repeated hereinafter for conciseness.

Figure 5:
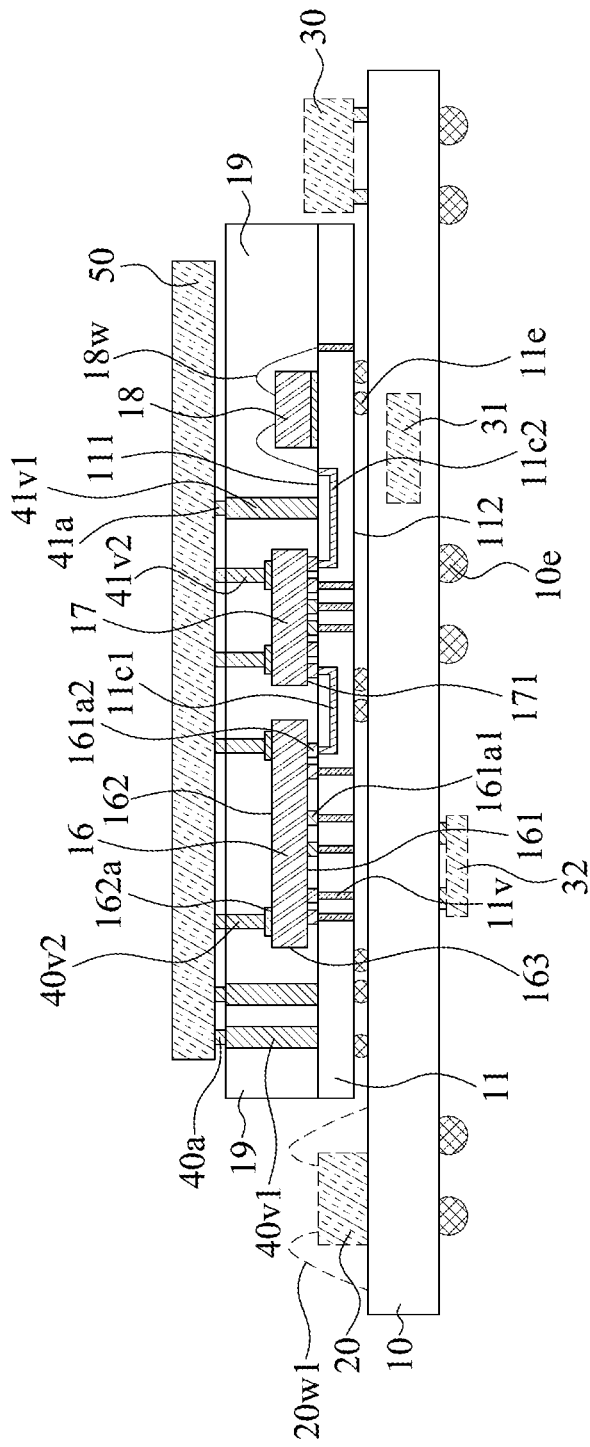
FIG. 5 illustrates a cross-sectional view of an example of an electronic device according to some embodiments of the present disclosure.

FIG. 5 illustrates a cross-sectional view of an example of an electronic device 5 according to some embodiments of the present disclosure. The electronic device 5 is similar to the electronic device 4 in FIG. 4, with differences therebetween as follows.

The power regulating devices 40 and 41 are combined as a monolithic structure as the power regulating device 50.

The power regulating device 50 may be configured to receive a power signal from a power source through the carrier 11 and the conductive via 40v1. The power regulating device 50 may regulate the power signal and provide a regulated power signal to the electronic component 16 through the conductive via 40v2. Similarly, the power regulating device 50 may be configured to receive a power signal from a power source through the carrier 11 and the conductive via 41v1. The power regulating device 50 may regulate the power signal and provide a regulated power signal to the electronic component 17 through the conductive via 41v2.

In some embodiments, the power regulating device 50 may further incorporate a data storage element or a memory device. For example, the power regulating device 50 may include, for example, a non-volatile memory (such as a flash memory and a read-only memory (ROM)) or a volatile memory (such as a Dynamic Random Access Memory (DRAM)). In some embodiments, the power regulating device 50 may include a high bandwidth memory (HBM).

In some embodiments, the power regulating device 50 may further incorporate a power regulating circuit or a passive component, such as an inductance device and/or a capacitance device, for routing the power paths.

In some embodiments, combining a memory device and a power regulating device may help with creating a highly integrated package. In addition, since the power regulating circuit can be integrated in the power regulating device 50, more I/O pins on the carrier 11 are available for high-speed data transmission.

FIG. 6A illustrates a top view of an example of an electronic device according to some embodiments of the present disclosure. In some embodiments, the electronic device 1 in FIG. 1A may have a top view as shown in FIG. 6A. In some embodiments, the electronic device in FIG. 6A along the line A-A' may have a cross-section as shown in FIG. 1A.

The electronic component 16 may include lateral surfaces, such as the surfaces 163, 164, 165, and 166.

A power regulating device 14-1 may be disposed adjacent to the surface 163 and may be electrically connected with the electronic component 16 through a power regulating circuit 12-1 integrated in the carrier 11. The power regulating circuit 12-1 may be electrically connected with the electronic component 16 through a conductive wire 16w-1 (or other connection element). The power regulating device 14-1 and the electronic component 16 may be collectively configured to provide a power path P2 extending along the surface 163 to a backside surface (such as the surface 162 in FIG. 1A) of the electronic component 16.

A power regulating device 14-2 may be disposed adjacent to the surface 164 and may be electrically connected with the electronic component 16 through a power regulating circuit 12-2 integrated in the carrier 11. The power regulating circuit 12-2 may be electrically connected with the electronic component 16 through a conductive wire 16w-2 (or other connection element).

A power regulating device 14-3 may be disposed adjacent to the surface 166 and may be electrically connected with the electronic component 16 through a power regulating circuit 12-3 integrated in the carrier 11. The power regulating circuit 12-3 may be electrically connected with the electronic component 16 through a conductive wire 16w-3 (or other connection element). The power regulating device 14-3 and the electronic component 16 may be collectively configured to provide a power path P2' extending along the surface 166 to a backside surface (such as the surface 162 in FIG. 1A) of the electronic component 16.

In some embodiments, the electronic component 16 may include different regions (such as the regions 16R1 and 16R2) configured to perform different functions, configured to receive different types of power control, and/or configured to receive different voltages of power. The power regulating devices 14-1, 14-2, and 14-3 may be configured to provide different types of power control to the different regions of the electronic component 16. For example, the power regulating devices 14-1, 14-2, and 14-3 may be configured to provide regulated power to the different regions of the electronic component 16. For example, the power regulating devices 14-1, 14-2, and 14-3 may be configured to provide different voltages of power to the different regions of the electronic component 16. For example, the power paths P2 and P2' may carry or provide different voltages of power. The regions 16R1 and 16R2 may receive different voltages of power. By using the power regulating devices 14-1, 14-2, and 14-3 adjacent to different regions of the electronic component 16 to provide different voltages of power, the power paths may be shorter, voltage drop thereof may be reduced, and supply power for the electronic component 16 may be lower.

The electronic component 16 may be surrounded by the power regulating devices 14-1, 14-2, and 14-3. In some embodiments, the power regulating devices 14-1, 14-2, and 14-3 may be spaced apart from a side of the electronic component 16 to make space for high-speed data transmission.

For example, the electronic component 17 may be disposed adjacent to the surface 165 and may be electrically connected with the electronic component 16 through the circuit region 11c1 of the carrier 11. The electronic component 17' may be disposed adjacent to the surface 165 and may be electrically connected with the electronic component 16 through the circuit region 11c1' of the carrier 11.

In some embodiments, the electronic component 17 may be electrically connected with the electronic component 18 through the circuit region 11c2 of the carrier 11. As shown, the circuit region 11c1 and the circuit region 11c2 are disposed over opposite sides of the electronic component 17.

A power regulating device 14-4 may be disposed adjacent to the surface 173' of the electronic component 17' and may be electrically connected with the electronic component 16 through a power regulating circuit 12-4 integrated in the carrier 11. The power regulating circuit 12-4 may be electrically connected with the electronic component 16 through a conductive wire 16w-4 (or other connection element). The power regulating device 14-4 and the electronic component 16 may be collectively configured to provide a power path extending along the surface 173' to a backside surface of the electronic component 17'.

A power regulating device 14-5 may be disposed adjacent to the surface 173 of the electronic component 17 and may be electrically connected with the electronic component 16 through a power regulating circuit 12-5 integrated in the carrier 11. The power regulating circuit 12-5 may be electrically connected with the electronic component 16 through a conductive wire 16w-5 (or other connection element). The power regulating device 14-5 and the electronic component 16 may be collectively configured to provide a power path extending along the surface 173 to a backside surface (such as the surface 172 in FIG. 1A) of the electronic component 17.

The power regulating devices 14-1, 14-2, 14-3, 14-4, and 14-5 may be similar to the power regulating device 14 in FIG. 1A. The power regulating circuit 12-1, 12-2, 12-3, 12-4, and 12-5 may be similar to the power regulating circuit 12 in FIG. 1A. Therefore, some detailed descriptions may refer to the corresponding preceding paragraphs and are not repeated hereinafter for conciseness.

Figure 6B:
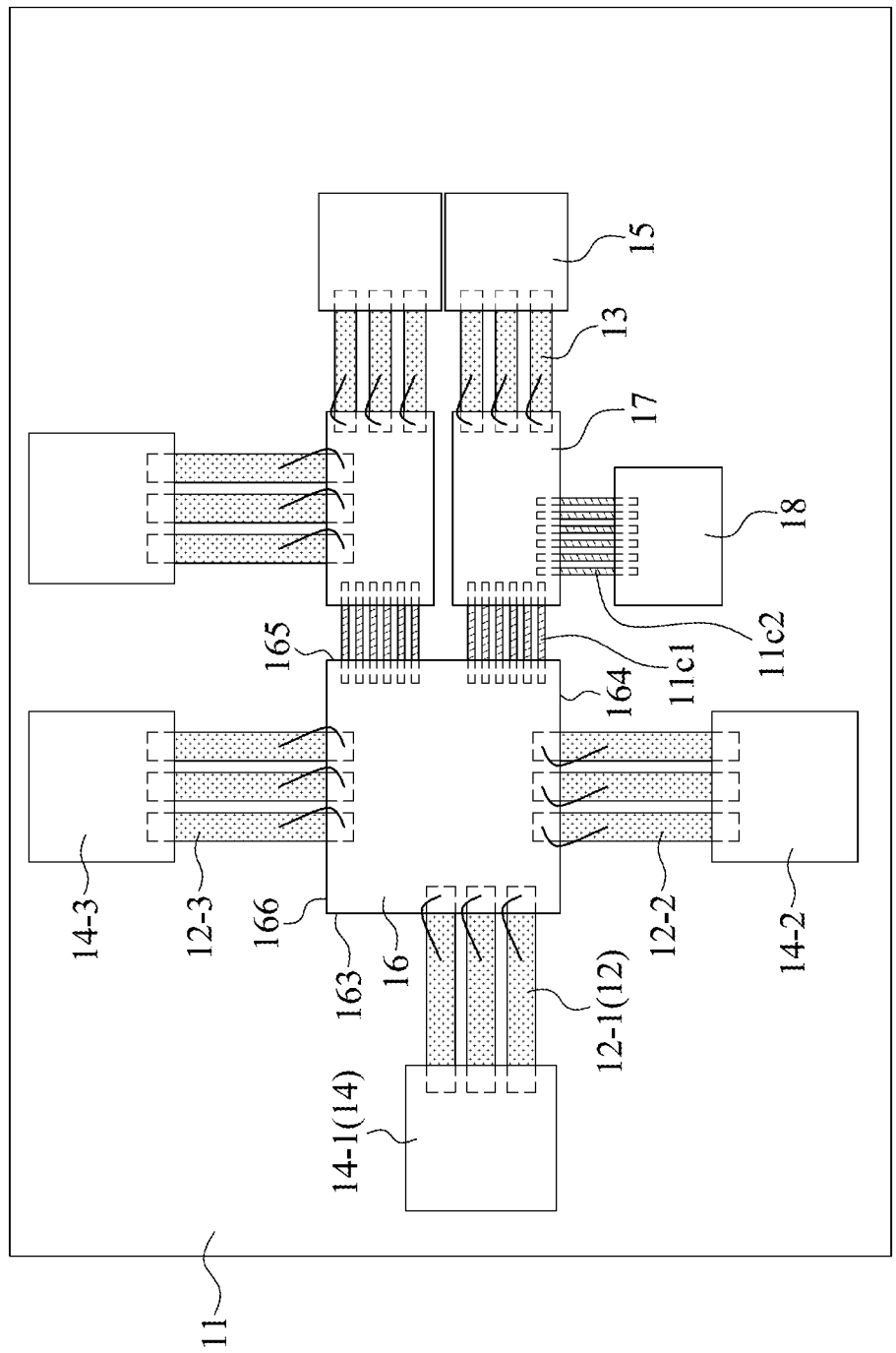
FIG. 6B illustrates a top view of an example of an electronic device according to some embodiments of the present disclosure.

FIG. 6B illustrates a top view of an example of an electronic device according to some embodiments of the present disclosure.

The top view in FIG. 6B is similar to the top view in FIG. 6A except that the circuit region 11c1 and the circuit region 11c2 are disposed over adjacent sides of the electronic component 17.

Figure 6C:
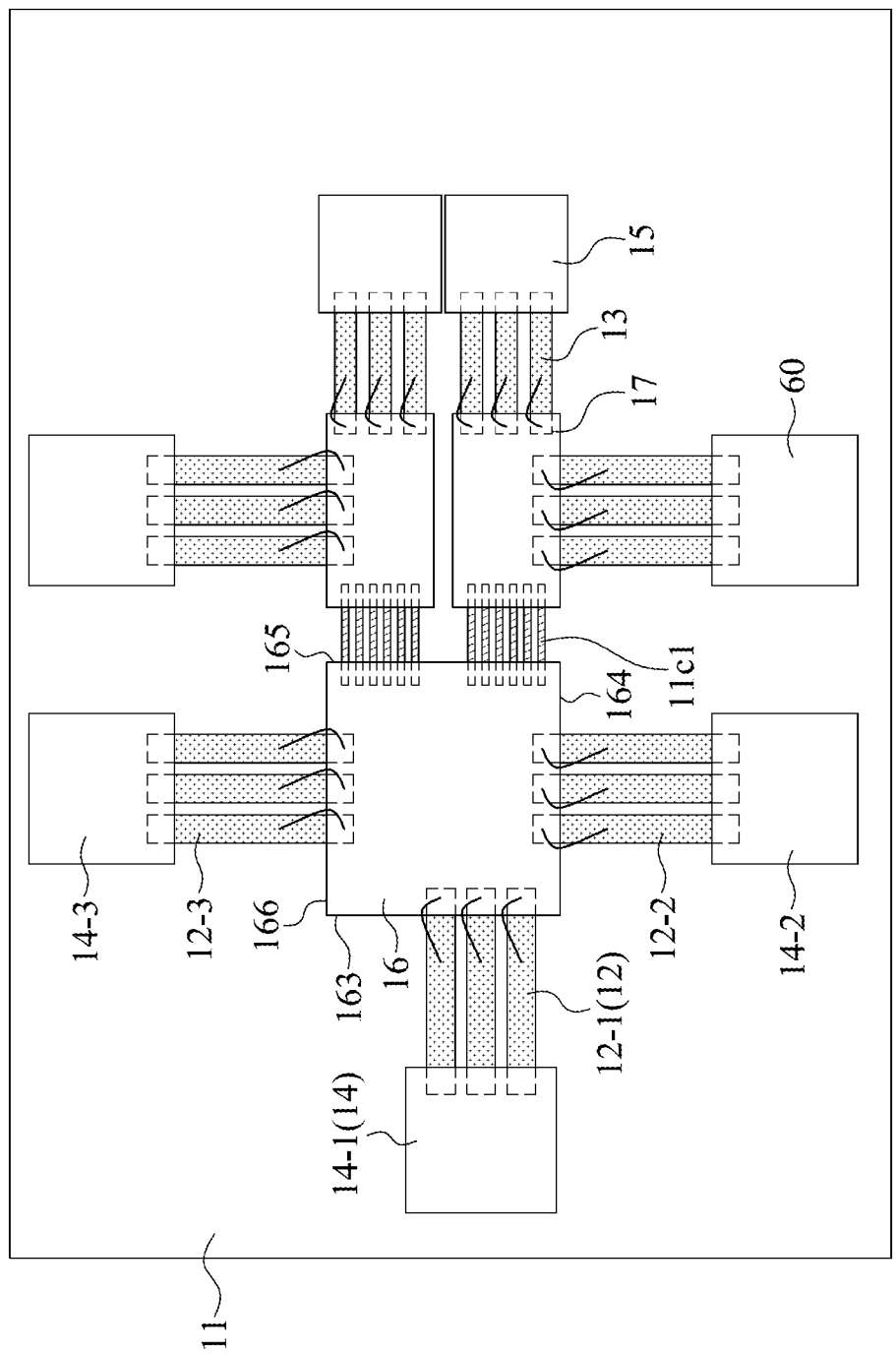
FIG. 6C illustrates a top view of an example of an electronic device according to some embodiments of the present disclosure.

FIG. 6C illustrates a top view of an example of an electronic device according to some embodiments of the present disclosure.

The top view in FIG. 6C is similar to the top view in FIG. 6B except that the electronic component 18 is replaced with a power regulating device 60.

For example, the electronic component 17 may include different regions configured to perform different functions, configured to receive different types of power control, and/or configured to receive different voltages of power. The power regulating devices 15 and 60 may be configured to provide different types of power control to the different regions of the electronic component 17.

Figure 6D:
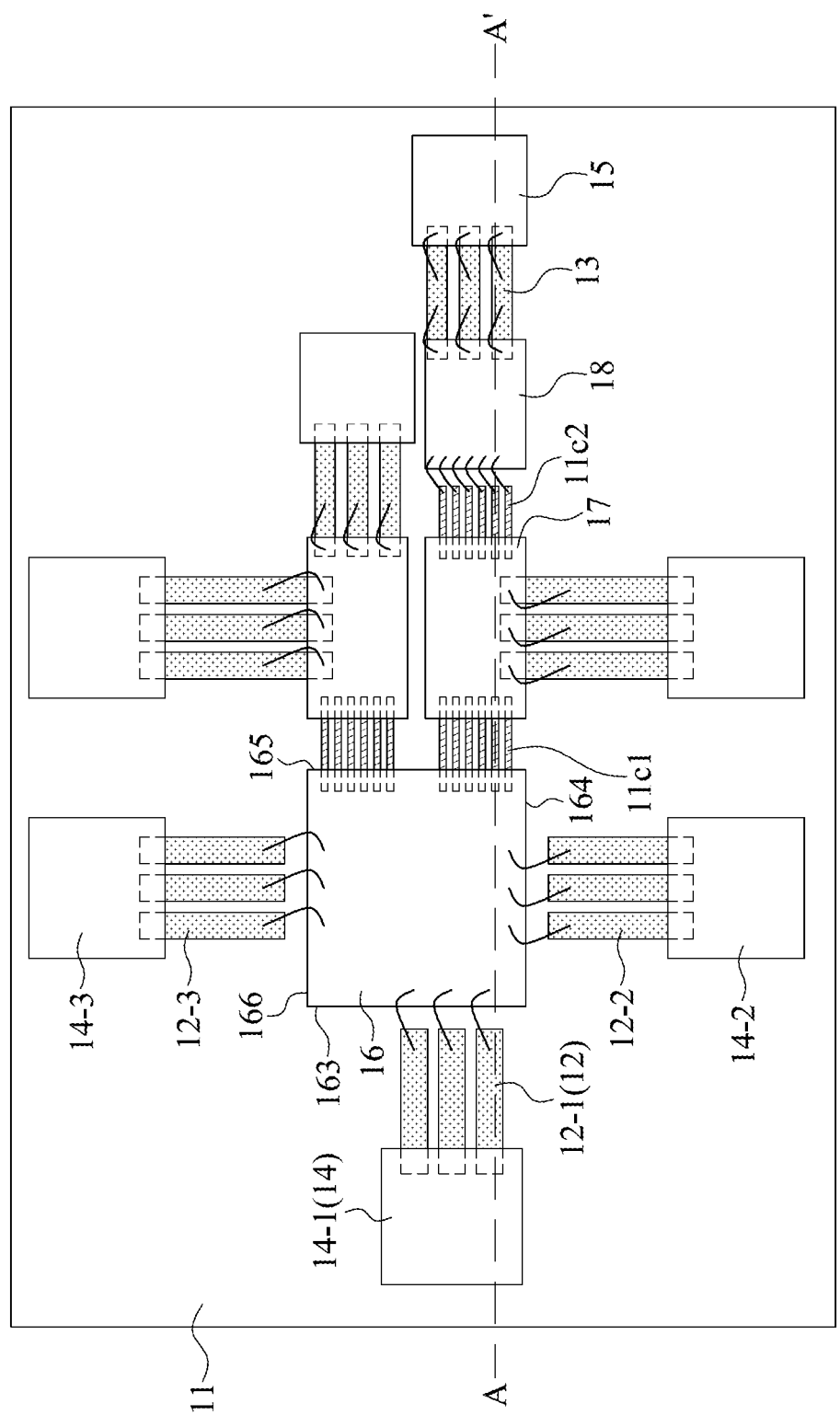
FIG. 6D illustrates a top view of an example of an electronic device according to some embodiments of the present disclosure.

FIG. 6D illustrates a top view of an example of an electronic device according to some embodiments of the present disclosure. In some embodiments, the electronic device 1' in FIG. 1B may have a top view as shown in FIG. 6D. In some embodiments, the electronic device in FIG. 6D along the line A-A' may have a cross-section as shown in FIG. 1B.

The top view in FIG. 6D is similar to the top view in FIG. 6A except that the electronic component 16 and the power regulating circuits 12-1, 12-2, and 12-3 are not overlapped. For example, the power regulating circuits 12-1, 12-2, and 12-3 may each be spaced apart from the electronic component 16.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
a carrier including a first region and a second region distinct from the first region;
an electronic component covering the first region and at least partially exposing the second region;
a first power regulating element in the second region of the carrier;
a second power regulating element at least partially overlapped with the first power regulating element; and
a third power regulating element disposed adjacent to a side of the carrier and electrically connected to the carrier,
wherein the second power regulating element is configured to regulate a power from the third power regulating element and provide a regulated power to the first power regulating element, and
wherein the second power regulating element is electrically connected to the electronic component through the first power regulating element to provide a first power path, and the first power path passes through a backside surface of the electronic component.

2. The electronic device of claim 1, further comprising:
a fourth power regulating element within the carrier and disposed at a first side of the electronic component;
wherein the first power regulating element is disposed at a second side of the electronic component adjacent to the first side of the electronic component; and
wherein the fourth power regulating element is electrically connected to the electronic component to provide a second power path passing through the backside surface of the electronic component.

3. The electronic device of claim 2, wherein the first power path is configured to transmit a first power having a first voltage, the second power path is configured to transmit a second power having a second voltage different from the first voltage.

4. The electronic device of claim 2, further comprising:
a fifth power regulating element at least partially overlapped with the fourth power regulating element, wherein the fifth power regulating element is configured to regulate a power from the carrier and provide a regulated power to the fourth power regulating element.

5. The electronic device of claim 1, further comprising:
a fourth power regulating element disposed adjacent to a side of the carrier; and
a connection element having a first end connected to the fourth power regulating element and a second end connected to the backside surface of the electronic component,
wherein the connection element is configured to provide a second power path between the fourth power regulating element and the electronic component, and the second power path is distinct from the first power path.

6. An electronic device, comprising:
a silicon interposer including a first region and a second region distinct from the first region;
an electronic component disposed over the first region of the silicon interposer;
a deep trench capacitor (DTC) in the second region of the silicon interposer; and
a first power regulating element disposed above the DTC and the silicon interposer,
wherein the DTC is configured to provide a power to the electronic component by a first power path passing through a backside surface of the electronic component, and
wherein the silicon interposer comprises a through silicon via (TSV) electrically connected to the first power regulating element to provide a second power path, and the first power regulating element is electrically connected to the DTC to connect the first power path with the second power path.

7. The electronic device of claim 6, further comprising:
a second power regulating element disposed adjacent to a side of the silicon interposer; and
a first connection element disposed over the second power regulating element, wherein the first connection element connects the second power regulating element to the DTC.

8. The electronic device of claim 7, further comprising:
a second connection element disposed over the silicon interposer, wherein the second connection element extends along a lateral surface of the electronic component and connects the DTC to the backside surface of the electronic component.

9. An electronic device, comprising:

a carrier including a first region and a second region distinct from the first region;

an electronic component disposed over the first region; and a first power regulating element in the second region of the carrier, wherein the first power regulating element and the electronic component are collectively configured to provide a first power path extending along a first lateral surface of the electronic component to a backside surface of the electronic component, and wherein the electronic component covers a portion of the first power regulating element and exposes a terminal of the first power regulating element as a part of the first power path.

10. The electronic device of claim 9, further comprising:

a first connection element disposed over the first lateral surface of the electronic component and electrically connecting the terminal of the first power regulating element with a conductive pad of the electronic component.

11. The electronic device of claim 9, further comprising:

a second power regulating element in the carrier and adjacent to a second lateral surface of the electronic component; and wherein the second power regulating element and the electronic component are collectively configured to provide a second power path extending along the second lateral surface of the electronic component to the backside surface of the electronic component.

12. The electronic device of claim 11, wherein the electronic component comprises a first portion and a second portion, wherein the first portion of the electronic component is configured to receive a first power from the first power regulating element and the second portion of the electronic component is configured to receive a second power from the second power regulating element, and wherein a voltage of the first power is different from a voltage of the second power.

13. The electronic device of claim 9, further comprising:

a memory unit disposed on a third lateral surface of the electronic component, wherein the carrier comprises a bridge circuit configured to provide a signal path between the electronic component and the memory unit.

14. The electronic device of claim 13, further comprising:

a third power regulating element in the carrier and adjacent to a side of the memory unit; and a third connection element having a first end connected to the third power regulating element and a second end connected to a backside surface of the memory unit to provide a third power path.

* * * * *